(12) United States Patent
Fiebag et al.

(10) Patent No.: US 6,383,717 B1
(45) Date of Patent: May 7, 2002

(54) AQUEOUS DEVELOPER FOR NEGATIVE WORKING LITHOGRAPHIC PRINTING PLATES

(75) Inventors: Ulrich Fiebag, Nienstaedt; Harald Baumann, Osterode/Harz; Hans-Joachim Timpe, Osterode, all of (DE)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 09/686,458

(22) Filed: Oct. 11, 2000

(51) Int. Cl.$^7$ ................................................. G03F 7/30
(52) U.S. Cl. ......................................................... 430/302
(58) Field of Search ........................................... 430/302

(56) References Cited

U.S. PATENT DOCUMENTS

| | | | |
|---|---|---|---|
| 5,035,982 A | 7/1991 | Walls | 430/331 |
| 5,126,229 A | 6/1992 | Akiyama et al. | 430/302 |
| 5,155,012 A | 10/1992 | Joerg et al. | 430/331 |
| 5,466,559 A | 11/1995 | Miller et al. | 430/331 |
| 6,329,122 B2 * | 12/2001 | Hotta et al. | 430/278.1 |

FOREIGN PATENT DOCUMENTS

EP  0033232  5/1981

* cited by examiner

*Primary Examiner*—Hoa Van Le
(74) *Attorney, Agent, or Firm*—Ratner & Prestia

(57) ABSTRACT

An aqueous developer for imageable elements that contain a radiation-sensitive initiator system and at least one free radical polymerizable material is disclosed. The developer develops these plates quickly, with high throughput, but with no sludge formation in the developing process. The developer contains water, a buffer, and one or more filter dyes and/or one of more free radical inhibitors. The imageable elements are useful as printing plates.

33 Claims, No Drawings

AQUEOUS DEVELOPER FOR NEGATIVE WORKING LITHOGRAPHIC PRINTING PLATES

FIELD OF THE INVENTION

This invention relates to lithographic printing. In particular, this invention relates to an aqueous developer for lithographic printing plates comprising a free radical polymerizable monomer and a radiation-sensitive initiator system.

BACKGROUND OF THE INVENTION

In lithographic printing, ink receptive areas, known as image areas, are generated on a hydrophilic surface. When the surface is moistened with water and ink is applied, the hydrophilic regions retain the water and repel the ink, and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plate precursors, typically called printing plates, typically comprise a radiation-sensitive coating applied over the hydrophilic surface of a support. If after exposure to radiation the exposed regions of the coating become soluble or dispersible in a developer and are removed in the developing process revealing the underlying hydrophilic surface of the support, the plate is called a positive-working printing plate. Conversely, if the exposed regions of the plate become insoluble in the developer, and the unexposed regions are removed by the developing process, the plate is called a negative-working plate. In each instance, the regions of the radiation-sensitive layer (i.e., the image areas) that remain are ink-receptive and the regions of the hydrophilic surface revealed by the developing process (i.e. the non-image areas) accept water and aqueous solutions, typically a fountain solution, and repel ink.

A common type of negative-working lithographic printing plate comprises a "photohardenable" radiation-sensitive coating applied to a support. When the composition is exposed to radiation, the exposed regions are "hardened" (i.e., rendered less soluble in the developer) by the radiation. When the imaged plate is developed, the unexposed regions are removed and the exposed regions remain to form the image (i.e., the photosensitive composition is negative-working). In one, type of plate, the radiation-sensitive coating contains a composition that undergoes radiation-initiated free radical polymerization. These compositions comprise at least one multifunctional free radical polymerizable material such as a monomer and/or oligomer, a radiation-sensitive initiator system that forms free radicals on exposure to radiation, and, typically, a binder.

Free radical polymerization has been initiated by exposure with ultraviolet, with visible, and with infrared radiation. Such systems are described, for example, in: Baumann, U.S. Pat. No. 5,700,619 (ultraviolet); Ali, U.S. Pat. No. 4,971,8922 (visible); and Kojima, U.S. Pat. No. 5,550,002 (infrared). To prevent oxygen inhibition of the free radical polymerization, these plates typically have an overcoat that functions as a barrier layer.

Developers that can be used to develop these printing plates have been described in, for example, Walls, U.S. Pat. No. 5,035,982 [EP 482,098] and Joerg, U.S. Pat. No. 5,155, 012 [EP 432,451]. However, when these developers are used, throughput (area of exposed printing plates developed, in $m^2$, per liter of developer) is limited due to formation of sludge. During the development process, the unpolymerized free radical polymerizable material and the radiation-sensitive initiator system are removed from the unexposed regions of the plate by the developer. At least part of this sludge is formed by polymerization of some of the unpolymerized free radical polymerizable material in the developer, a process that is mainly initiated by interaction between the radiation-sensitive initiator system and the ambient radiation. Sludge is deposited on the rollers of the processor, which transfers it to both the image and non-image regions of the plate during development, adversely affecting the image produced by the printing plate. Thus, a need exists for an aqueous developer composition that develops these plates quickly, with high throughput, but with no sludge formation in the developing process.

SUMMARY OF THE INVENTION

In one embodiment, the invention is a composition for developing an imageable element comprising a negative-working composition that comprises a free radical polymerizable material and an initiator system. The method comprises the steps of:

(A) providing an imagewise exposed imageable element, in which:
  the imageable element comprises a radiation-sensitive layer over a support,
  the radiation-sensitive layer comprises a radiation-sensitive initiator system and at least one free radical polymerizable material, and
  the radiation-sensitive layer comprises exposed regions and unexposed regions;
(B) applying a developer to the imagewise exposed imageable element, removing the unexposed regions of the imageable element, and forming the image in which:
  the developer has a pH of about 5.0 to about 12.0, and
  the developer comprises:
    water,
    a buffer, and
    a component selected from the group consisting of
      (a) an added filter dye or mixture of filter dyes, and
      (b) an added free radical inhibitor or mixture of free radical inhibitors.

In one embodiment, the developer comprises about 75 wt % to about 98 wt % of water, a buffer, and about 0.1 to 2 wt % of the filter dye or mixture of filter dyes, or about 0.1 to about 3.0 wt % of the free radical inhibitor or mixture of free radical inhibitors. The filter dye or mixture of filter dyes and/or the free radical inhibitor or mixture of free radical inhibitors may be present in the developer. The developer may additionally comprise a surfactant or a mixture of surfactants and/or an organic solvent or a mixture of organic solvents.

In another embodiment, the invention is a composition useful as a developer for imageable elements that comprise a radiation-sensitive initiator system and at least one free radical polymerizable material. The composition comprises:
  about 75 wt % to about 98 wt % of water;
  about 0.5 wt % to about 15 wt % of an organic solvent or mixture of organic solvents;
  about 0.5 wt % to about 15 wt % of a surfactant or mixture of surfactants;
  a buffer, and
  about 0.1 to 2 wt % of a filter dye or mixture of filter dyes, or about 0.1 to about 3.0 wt % of a free radical inhibitor or mixture of free radical inhibitors;

in which the composition has a pH of about 5.0 to about 12.0.

DETAILED DESCRIPTION OF THE INVENTION

Negative-working radiation-sensitive compositions are often referred to as "hardenable compositions," "photohardenable compositions," or "photoinsolubilizable compositions" because they become developer insoluble on exposure to radiation. Typically, these radiation-sensitive compositions comprise materials that undergo crosslinking, dimerization, and/or free radical polymerization on exposure to radiation. To produce an imageable element, a layer of the radiation-sensitive composition is coated over a support, such as aluminum, or a polymer film, such as polyethylene terephthalate film. The imaged and developed element is useful as a printing plate. The unimaged element is variously referred to as a "printing plate," a "printing plate precursor," or a "printing form."

Radiation-sensitive polymerizable compositions comprise at least one ethylenically unsaturated material that undergoes free radical initiated polymerization. The material may be a monomer, an oligomer, or a prepolymer or macromer. These materials are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylate and methacrylate, epoxide acrylate and methacrylate, polyester acrylate and methacrylate, polyether acrylate and methacrylate or unsaturated polyester resins, may also be used. Mixtures of monomers and oligomers and/or prepolymers are frequently used. Free radical polymerization of these materials produces highly crosslinked, insoluble materials.

The radiation-sensitive composition typically also comprises a radiation-sensitive initiator system, which initiates polymerization of the free radical polymerizable material on exposure to ultraviolet, visible, and/or infrared radiation. The radiation-sensitive initiator system may be a single compound or a mixture of compounds. Radiation-sensitive compositions that are sensitive to ultraviolet and/or visible radiation comprise a free radical generating initiator system known as a photoinitiator system. An ultraviolet-sensitive photoinitiator system is typically activated by radiation in the range of from 300 to 450 nm. Many photoinitiator systems that are activated by visible radiation can be activated by radiation with wavelengths up to about 750 nm. Many infrared-sensitive initiator systems, i.e., initiator systems sensitive to radiation in the range of about 800 nm to about 1100 nm, are also sensitive to radiation in the ultraviolet and/or visible regions. Photoinitiator systems are disclosed in "Photoinitiators for Free radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525.

Radiation-sensitive compositions also typically comprise at least one preformed macromolecular polymeric material, generally know as a binder. Typical binders are poly(methyl methacrylate) and copolymers of methyl methacrylate with other alkyl acrylates, alkyl methacrylates, methacrylic acid, and/or acrylic acid. Numerous other binders useful in radiation-sensitive compositions are known to those skilled in the art.

During the development process, the unexposed regions of the imageable element are removed by the developer. Both the radiation-sensitive initiator system and the free radical polymerizable material or materials present in the unexposed regions build up in the developer. Excitation of the radiation-sensitive initiator system in the developer by ambient ultraviolet and/or visible radiation initiates polymerization of the polymerizable material present in the developer. The cross-linked polymer thus formed precipitates from solution as sludge or is deposited on the rollers, especially the squeezing rollers of the processor.

Sludge formation may be prevented by the presence of at least one material selected from the group consisting of filter dyes and free radical inhibitors in the developer. Filter dyes absorb ambient ultraviolet and visible radiation and reduce the amount absorbed by the radiation-sensitive initiator system present in the developer. Free radical inhibitors inhibit free radical polymerization of the monomer in the loaded developer.

The absorption of the filer dye is matched to the absorption of the radiation-sensitive initiator system. Preferably, the filter dye has an absorption maximum with its longest wavelength at or below 650 nm. Any filter dye that absorbs strongly (i.e., has a large extinction coefficient) in the same region of the spectrum as the radiation-sensitive initiator system and has the properties discussed below can be used as the filter dye. However, preferably, the filter dye absorbs from at least 300 nm to about 650 nm, more preferably from about 350 nm to 550 nm, depending on the region of the spectrum to which the radiation-sensitive initiator system in the plate is sensitive.

The filter dye should be stable in the developer and should not undergo any chemical reaction or interaction with the components of the aqueous developer, or the radiation-sensitive layer. The filter dye must not adversely affect the properties of either the developer or the printing plate. For example, it must not be an initiator, i.e. a compound that generates free radicals when activated by actinic radiation, or a sensitizer, i.e., a compound that activates the radiation-sensitive initiator system of the radiation-sensitive composition when activated by actinic radiation, which could accelerate sludge formation in the developer bath.

The concentration of filter dye required to produce the stabilizing effect under daylight or similar conditions will depend on a number factors including: the wavelength and intensity of the ambient light, the concentration of the radiation-sensitive initiator system in the developer, the absorption spectrum of the radiation-sensitive initiator system, and the absorption spectrum of the filter dye. This concentration can be readily determined by methods known to those skilled in the art. However, the concentration of dye is typically about 0.1 to 2 wt %, based on the weight of the developer, preferably about 0.4% to 2 wt %, based on the weight of the developer. The extinction coefficient of the filter dye at its longest wavelength absorption maximum is typically about 20 to 90 L/g-cm, preferably about 40 to 70 L/g-cm. The optical density of a 1 cm pathlength of the developer (i.e., measured in a 1 cm cuvette) at the longest wavelength maximum of the filter dye is greater than about 2, preferably greater than 2.

The dye must be sufficiently soluble in the developer that enough dye can be dissolved in the developer to absorb radiation in the region of about 350 nm to about 650 nm region of the spectrum. Dyes that substituted with one of more sulfonic acid groups will typically have sufficient solubility in the developer. Preferred dyes include yellowish, yellow, orange and red dyes substituted with sulfonic acid groups. Especially preferred are sulfonated azo dyes. Suitable dyes include, for example, metanil yellow (C.I. 13065) and other similar water soluble azo dyes, such as, for example, methyl orange (C.I. 13025), tropaeoline 0 (C.I. 14270), tropaeoline OO (C.I. 13080), tartrazine (C.I. 19140); Oxonol Yellow K (Riedel-de-Haen); dyes of the acid yellow type, such as C.I. 13900, C.I. 14170, C.I. 18835, C.I. 18965, C.I. 18890, C.I. 18900, C.I. 18950 (polar yellow), C.I. 22910, and C.I. 25135; and dyes of the acid red type, such as C.I. 14710, C.I. 14900, C.I. 17045, C.I. 18050, C.I. 18070, and C.I. 22890. Other suitable dyes will be readily apparent to those skilled in the art. A single filter dye or a mixture of filter dyes can be used.

Sludge formation may also be prevented by the presence of a free radical inhibitor or a mixture of free radical inhibitors in the developer. Free radical inhibitors, also known as polymer stabilizers or free radical traps, are well known in the art of monomer and polymer stabilization. The free radical inhibitor inhibits or prevents polymerization of the monomers during the developing process, especially on the transport and squeezing rollers of the processor.

Any material that is capable of reacting with a free radicals to form products that do not initiate polymerization of the monomer, that has the necessary solubility and stability in the developer, and that does not adversely affect the properties of either the developer or the printing plate can potentially be used. They include, for example: compounds containing quinone or hydroquinone moieties, especially benzoquinone and substituted benzoquinones, and hydroquinone and substituted hydroquinones, such as 2,6-dimethyl hydroquinone; ethers of hydroquinones, especially of hydroquinone and substituted hydroquinones, such as hydroquinone monomethyl ether (4-methoxphenol), t.-butylhydroquinone (4-t-butylphenol, TBHQ),and t-butyl hydroxyanisol (BHA); recorcinol; pyrrogallol; phosphite esters; and hindered phenols and bisphenols, such as 2,6-di-t-butyl4-methylphenol (BHT), and 2,6-di-t-butyl4-methoxyphenol, 2,4,6-tri-t-butylphenol; stable free radicals, such as di-t-butyl nitroxide and 2,2,6,6-tetramethyl4-pyridone nitroxide; nitro substituted aromatics; amino phenols; phenothiazine; and secondary diaryl amines such as substituted diphenyl amines, N,N'-diphenyl-p-phenylenediamine, and N-phenyl-naphthyl amine. Preferred radical inhibitors are quinones, hydroquinones, ethers of hydroquinones, and hindered phenols. More preferred are ethers of hydroquinones, especially ethers of hydroquinone and hindered phenols. Preferred compounds are hydroquinone monomethyl ether (4-methoxphenol), 2,6-di-t-butyl4-methylphenol, and 2,4,6-tri-t-butylphenol. A single free radical inhibitor or a mixture of free radical inhibitors can be used. The free radical inhibitor or mixture of free radical inhibitors is typically present in the developer at a concentration of about 0.1 wt % to about 3.0 wt % based on the weight of the developer, preferably about 0.5 wt % to about 1.5 wt %, based on the weight of the developer.

As is well known to those skilled in the art, the radiation-sensitive layer of printing plates may comprise dyes and the polymerizable materials contained in the radiation-sensitive layer of printing plates may comprise polymerization inhibitors. When the unexposed regions of the radiation-sensitive layer are removed during the development process, these materials may accumulate in the developer. Accordingly, for purposes of this invention, when it is said that the developer contains an "added" filter dye or free radical inhibitor, this is meant to exclude any filter dye or dyes or polymerization inhibitor or inhibitors derived from the radiation-sensitive layer of the imageable element during the development process. However, because typically only small amounts of these materials are contained in the radiation-sensitive layer, only small amounts of these materials accumulate in the developer, typically less than 0.1. wt % of dye or dyes and less than 0.1% by weight of polymerization inhibitor or inhibitors.

The developer may also comprise a surfactant or a mixture of surfactants. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The surfactant or mixture of surfactants typically comprises about 0.5 wt % to about 15 wt % based on the weight of the developer, preferably about 3 wt % to about 8 wt %, based on the weight of the developer. As is well known to those skilled in the art, many surfactants are supplied as aqueous surfactant solutions. These percentages are based on the amount of surfactant (i.e. the amount of active ingredient or ingredients exclusive of water and other inactive materials in the surfactant solution) in the developer.

A developer may also comprise a buffer system to keep the pH relatively constant, typically between about 5.0 and about 12.0, preferably between about 6.0 and about 11.0, more preferably between about 8.0 and about 10.0. Numerous buffer systems are known to those skilled in the art. Typically buffer systems include, for example: combinations of water-soluble amines, such as mono-ethanol amine, diethanol amine, tri-ethanol amine, or tri-i-propyl amine, with a sulfonic acid, such benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid.

Water typically comprises about 75 wt % to about 98 wt % of the developer, based on the weight of the developer; preferably about 80 wt % to 95 wt % of the developer, based on the weight of the developer; and more preferably about 85 wt % to 92 wt % of the developer, based on the weight of the developer.

The developer may also comprise an organic solvent or a mixture of organic solvents. The developer is a single phase. Consequently, the organic solvent must be misable with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 w% and about 5 wt %, based on the weight of the developer.

INDUSTRIAL APPLICABILITY

The developer can be used to develop imageable elements useful as printing plates, especially those that comprise a radiation-sensitive initiator system and at least one free radical polymerizable material. The developer provides high throughput, and rapid and complete removal of the unimaged (unexposed) regions combined with a cleaning effect on these regions. Neither the imaged (exposed) regions nor the aluminia (front side) of the printing plate or the aluminum (backside) of the printing plate are attacked by the developer. Cleaning of the developer processor is fast and easy and only requires running water. The developer removes both the overcoat and the main coat of the printing plate in one easy step. The developer does not have an odor and can be stored and used without refrigeration. There is no need to control pH or conductivity during development.

The imageable element is imaged by imagewise exposure to ultraviolet, visible, or infrared radiation. After imaging, the radiation-sensitive layer of the imaged element comprises exposed (imaged) and unexposed (unimaged) regions. Developer is applied to the imaged element. The developer removes the unexposed regions of the radiation-sensitive layer but does not remove the exposed regions of the radiation-sensitive layer. The exposed regions remain and form an image.

Typically, the developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced. The developing process is conveniently carried out in a commercial processor, such as the MercuryNews Processor (Kodak Polychrome Graphics), Sprinter 72 (Kodak Polychrome Graphics), and PC 85 (Unigraph Ltd.).

The advantageous properties of this invention can be observed by reference to the following examples, which illustrate but do not limit the invention. In the specification, examples, and claims, unless indicated otherwise, all percentages are percentages by weight based on the weight of the developer.

| Glossary | |
|---|---|
| DOWANOL ® EPh | Ethylene glycol phenyl ether (Dow Chemical, Midland, MI USA) |
| DOWANOL ® PM | Propylene glycol methyl ether acetate (Dow Chemical, Midland, MI USA) |
| Metanil yellow | Acid yellow 36 (C.I. 13065); Benzenesulfonic acid, 3-[[4-(phenylamino)phenyl]azo]-, sodium salt |
| Petro AA | Sodium naphthalene sulfonate (Witco) |
| TEXAPON ® CPS | Sodium alkyl sulfate (Henkel, Düsseldorf, Germany) |

EXAMPLE

Developer Preparation

The following developers were prepared:

Developer 1—85.28% water, 1% 4-methoxyphenol, 2.6% TEXAPON® CPS, 5.3% Petro AA, 1.2% diethanol amine, 0.12% 4-toluene sulfonic acid, and 4.5% DOWANOL® EPh solvent. The pH of the developer was 9.9.:

Developer 2—82.78% water, 1% metanil yellow, 3.6% TEXAPON® CPS, 7.1% Petro AA, 1.6% diethanol amine, 0.12% 4-toluene sulfonic acid, and 3.8% DOWANOL® EPh solvent. The pH of the developer was 9.9.

Developer 3—86.48% water, 1% metanil yellow, 1% 4-methoxyphenol, 2.7% TEXAPON® CPS, 5.4% Petro M, 1.2% diethanol amine, 0.12% 4-toluene sulfonic acid, and 2.1% DOWANOL® EPh. The pH of the developer was 9.9.

Developer 4—99% Developer 955 (commercial developer from Kodak Polychrome Graphics) and 1% 2,6-di-t-butyl4-methylphenol. The pH of the developer was 10.7.

Developer 5—99% developer of EP 0 602 736 [Miller, U.S. Pat. No. 5,466,559] and 1% 4-methoxyphenol. The pH of the developer was 9.5.

Developer 6—92.45% water, 1% metanil yellow, 4.4% sodium heptyl sulfate, 2% diethanol amine, and0.15% 4-toluene sulfonic acid. The pH of the developer was 10.0.

Developer 7 (Comparison Developer)—86.28% water, 2.6% TEXAPON® CPS, 5.3% Petro AA, 1.2% diethanol amine, 0.12% 4-toluene sulfonic acid, and 4.5% DOWANOL® EPh solvent. The pH of the developer was 9.9.

Daylight Sensitivity of a Loaded Developer

Developer 1 (1 L) was loaded with 25 $m^2$ of VITESSE® 4 printing plates (Kodak Polychrome Graphics) and stored in closed, clear glass bottles for 4 days. One bottle was stored in a daylight room and another was stored in a yellow-light room. No precipitate formed in either bottle.

The procedure was repeated with the comparison developer (Developer 7). After 4 days a precipitate had formed in the developer stored in the day-light room and a lesser amount of precipitate had formed in the developer stored in the yellow-light room.

Developer Evaluation

The developers were evaluated by the following procedure. VITESSE® 4 and T96-3 printing plates (Kodak Polychrome Graphics) were cut to 790×850 mm. These plates comprise a developer-soluble protective overlayer and a photohardenable layer comprising a monomer, a binder, and a radiation-sensitive initiator system. The VITESSE® 4 printing plates were exposed with 20 $mJ/cm^2$ of radiation from a metal halide lamp (MH-Burner) through a negative silver halide test wedge (Fogra) with a density range of 0.1.5 to 1.95 in 0.15 increments. The 96-3 printing plates were infrared exposed on a Trendsetter 3244 (Creo/Heidelberg) using an energy of 7.5 W and a drum speed of 165 rpm. The KODAK® Professional Colorflow Strip (Eastman Kodak), which contains different elements for evaluation the quality of copies, was used for imaging. Exposed plates were processed in a MercuryNews Processor (Kodak Polychrome Graphics), equipped with a heating section, a pre-wash section, an immersion-type developing bath, a section for rinsing with water, and a gumming and drying section. The processor was filled with 40 L of developer. Separately, a container containing developer was attached to the processor and 25 $mL/m^2$ of printing plate developed was added to the developer solution via a pump.

The following parameters were kept constant in all tests:

| | |
|---|---|
| temperature setting | 620, giving a temperature on the back side of 115° C. in front of the plate and 125° C. at the end of the plate. |
| processor speed | 1.20 m/min |
| pre-wash rate | 500 $mL/m^2$ of plate |
| dwell time in processor | 25 sec |
| temperature of developing bath | (23 ± 1)° C. |

To evaluate the copies after pre-heating and processing, the following criteria were examined.

VITESSE® 4 printing plates—steps of the gray wedge that are not covered at all (referred to as GW) and microlines that have not yet been attacked (referred to as ML);

T96-3 printing plates—reproduction of the 1 and 2 pixel elements, optical density of the checkerboard dots of the pixel elements (measured with a D19C/D196 Gretag/Macbeth apparatus).

Stability and Load Tests

The plates were developed at a rate of 200 plates per day for 25 days (5 weeks excluding weekends). Processing was carried out in a daylight room. In addition to the criteria described above, precipitation of insoluble material on the bottom of the processor and reposition on the unimaged (unexposed) regions was evaluated for each developer.

The results for the VITESSE® 4 printing plates are given in Table 1. The results for the T96-3 plates are given in Table 2. At loading rates below those used in Tables 1 and 2, the processor could be easily cleaned by rinsing with water, and no residue remained.

TABLE 1

Developer Evaluation with VITESSE ® 4 Printing Plates

| Developer | GW | ML | Throughput[a] |
|---|---|---|---|
| 1 | 9 | 15 | 32 |
| 2 | 9 | 15 | 29 |
| 3 | 9 | 15 | 27 |
| 4 | 10 | 20 | 27 |
| 5 | 10 | 20 | 17 |
| 6 | 10 | 20 | 21 |
| 7[B] | 10 | 20 | 18 |

[a]Loading, in $m^2$ of plates at which re-deposition on the non-image areas of the plate, precipitation on the processor rollers, or precipitation on the bottom of the processor was observed.
[b]Comparison developer.

TABLE 2

Developer Evaluation with T 96-3 Printing Plates

| Developer | 1 × 1 pixel | optical density %[a] | Throughput[b] |
|---|---|---|---|
| 1 | attacked | 49 | 33 |
| 2 | attacked | 49 | 31 |
| 3 | attacked | 50 | 30 |
| 4 | not attacked | 51 | 29 |
| 5 | not attacked | 50 | 28 |
| 6 | not attacked | 51 | 25 |
| 7[c] | attacked | 49 | 17 |

[a]Optical density of the 50% checkerboard dots of the 2 × 2 pixel element.
[b]Loading, in $m^2$ of plates at which re-deposition on the non-image areas of the plate, precipitation on the processor rollers, or precipitation on the bottom of the processor was observed.
[c]Comparison developer.

Press Performance

A VITESSE® 4 printing plate and a T96-3 printing plate, each of which had been exposed as described above and processed in Developer 1 loaded with about 15 $m^2$/L, were mounted on a sheet-fed offset press and proofed. The image areas of each plate accepted ink without any problems, and the paper copies did show any toning in the non-image areas. After about 1,000 copies, the press was stopped for about 30 minutes and then restarted. The image areas of each plate again accepted ink without any problems, and the paper copies did show any toning in the unimaged (non-image) regions.

Having described the invention, we now claim the following and their equivalents.

What is claimed is:

1. A method for forming an image, the method comprising the steps of:
   (A) providing an imagewise exposed imageable element, in which:
      the imageable element comprises a radiation-sensitive layer over a support,
      the radiation-sensitive layer comprises a radiation-sensitive initiator system and at least one free radical polymerizable material, and
      the radiation-sensitive layer comprises exposed regions and unexposed regions;
   (B) applying a developer to the imagewise exposed imageable element, removing the unexposed regions of the imageable element, and forming the image, in which:
      the developer has a pH of about 5.0 to about 12.0,
      the developer comprises:
         water,
         a buffer, and
         a component selected from the group consisting of
            (a) an added filter dye or mixture of filter dyes, and
            (b) an added free radical inhibitor or mixture of free radical inhibitors,
      the absorption of the filter dye is matched to the absorption of the radiation-sensitive initiator system, and
      the free radical inhibitor is a material capable of reacting with free radicals to form products that do not initiate polymerization of the free radical polymerizable material.

2. The method of claim 1 in which the developer comprises both (a) the filter dye or mixture of filter dyes and (b) the free radical inhibitor or mixture of free radical inhibitors.

3. The method of claim 1 in which the developer has a pH of 6.0 to 11.0.

4. The method of claim 1 in which the developer additionally comprises a water-soluble organic solvent or mixture of water-soluble organic solvents and a surfactant or mixture of surfactants.

5. The method of claim 4 in which the developer has a pH of 6.0 to 11.0.

6. The method of claim 5 in which the developer comprises both (a) the filter dye or mixture of filter dyes and (b) the free radical inhibitor or mixture of free radical inhibitors.

7. The method of claim 6 in which the developer has a pH of 8.0 to 10.0.

8. The method of claim 7 in which the optical density of a 1 cm pathlength of the developer at the longest wavelength maximum of the filter dye is greater than about 2.

9. The method of claim 1 in which the developer comprises about 75 wt % to about 98 wt % of the water; the buffer; and either (a) about 0.1 to 2 wt % of the filter dye or the mixture of filter dyes, or (b) about 0.1 to about 3.0 wt % of the free radical inhibitor or the mixture of free radical inhibitors.

10. The method of claim 9 in which the developer comprises both (a) the filter dye or mixture of filter dyes and (b) the free radical inhibitor or mixture of free radical inhibitors.

11. The method of claim 9 in which the developer has a pH of 6.0 to 11.0.

12. The method of claim 9 in which the developer additionally comprises a water-soluble organic solvent or mixture of water-soluble organic solvents and a surfactant or mixture of surfactants.

13. The method of claim 9 in which the developer has a pH of 6.0 to 11.0.

14. The method of claim 9 in which the developer comprises both (a) the filter dye or mixture of filter dyes and (b) the free radical inhibitor or mixture of free radical inhibitors.

15. The method of claim 14 in which the developer has a pH of 8.0 to 10.0.

16. The method of claim 15 in which the optical density of a 1 cm pathlength of the developer at the longest wavelength maximum of the filter dye is greater than about 2.

17. The method of claim 9 in which the developer additionally comprises about 0.5 wt % to about 15 wt % of a water-soluble organic solvent or mixture of water-soluble organic solvents and about 0.5 wt % to about 15 wt % of a surfactant or mixture of surfactants.

18. The method of claim 17 in which the developer has a pH of 8.0 to 10.0.

19. The method of claim 18 in which the developer comprises the filter dye or mixture of filter dyes.

20. The method of claim 18 in which the developer comprises the free radical inhibitor or mixture of free radical inhibitors.

21. The method of claim 18 in which the developer comprises both (a) the filter dye or mixture of filter dyes and (b) the free radical inhibitor or mixture of free radical inhibitors.

22. The method of claim 1 in which the developer has a pH of about 8.0 to about 10.0, and the developer comprises about 80 wt % to about 95 wt % of the water; about 0.5 wt % to about 15 wt % of a water-soluble organic solvent or mixture of water-soluble organic solvents; about 0.5 wt % to about 15 wt % of a surfactant or mixture of surfactants; the buffer, and about 0.4 to 2 wt % of the filter dye or mixture of filter dyes, or about 0.5 to about 1.5 wt % of the free radical inhibitor or mixture of free radical inhibitors.

23. The method of claim 22 in which the developer comprises both (a) the filter dye or mixture of filter dyes and (b) the free radical inhibitor or mixture of free radical inhibitors.

24. The method of claim 1 in which the filter dye absorbs radiation in the region of about 350 nm to 550 nm.

25. The method of claim 8 in which the filter dye absorbs radiation in the region of about 350 nm to 550 nm.

26. The method of claim 10 in which the filter dye absorbs radiation in the region of about 350 nm to 550 nm.

27. The method of claim 23 in which the filter dye absorbs radiation in the region of about 350 nm to 550 nm.

28. The method of claim 1 in which the filter dye is Metanil Yellow.

29. The method of claim 28 in which the developer comprises both (a) the filter dye or mixture of filter dyes and (b) the free radical inhibitor or mixture of free radical inhibitors.

30. The method of claim 29 in which the free radical inhibitor is 2,6-di-t-butyl-4-methylphenol.

31. The method of claim 1 in which the free radical inhibitor is 2,6-di-t-butyl-4-methylphenol.

32. The method of claim 14 in which the filter dye is Metanil Yellow and the free radical inhibitor is 2, 6-di-t-butyl-4-methylphenol.

33. The method of claim 22 in which the filter dye is Metanil Yellow and the free radical inhibitor is 2,6-di-t-butyl-4-methylphenol.

* * * * *

UNITED STATES PATENT AND TRADEMARK OFFICE
CERTIFICATE OF CORRECTION

PATENT NO. : 6,383,717 B1
DATED : May 7, 2002
INVENTOR(S) : Fiebag et al.

It is certified that error appears in the above-identified patent and that said Letters Patent is hereby corrected as shown below:

<u>Column 8,</u>
Line 1, delete "Petro M" and insert therefore -- Petro AA --;
Line 18, delete "EPh" and insert therefore -- PM --.

Signed and Sealed this

Thirty-first Day of December, 2002

JAMES E. ROGAN
*Director of the United States Patent and Trademark Office*